United States Patent [19]

Leupp et al.

[11] 4,024,626
[45] May 24, 1977

[54] METHOD OF MAKING INTEGRATED TRANSISTOR MATRIX FOR FLAT PANEL LIQUID CRYSTAL DISPLAY

[75] Inventors: Alex M. Leupp, Costa Mesa; Lewis T. Lipton, Olivenhain, both of Calif.; Hans G. Dill, Marin-Neuchatel, Switzerland

[73] Assignee: Hughes Aircraft Company, Culver City, Calif.

[22] Filed: Feb. 18, 1976

[21] Appl. No.: 659,184

Related U.S. Application Data

[62] Division of Ser. No. 530,586, Dec. 9, 1974, abandoned.

[52] U.S. Cl. .................. 29/571; 29/577; 29/580; 357/41; 357/45
[51] Int. Cl.² ........................... B01J 17/00
[58] Field of Search .............. 29/571, 577, 576 OC, 29/576 IC, 580; 357/4, 41, 45

[56] References Cited

UNITED STATES PATENTS

| 3,564,135 | 2/1971 | Weimer | 357/4 |
|---|---|---|---|
| 3,636,418 | 1/1972 | Burns | 357/4 |
| 3,749,614 | 7/1973 | Boleky | 357/4 |

*Primary Examiner*—W. Tupman
*Attorney, Agent, or Firm*—W. H. MacAllister; Joseph E. Szabo

[57] ABSTRACT

Substantial advantages over existing integrated transistorized matrices for driving flat panel liquid crystal displays may be achieved by the use of silicon on sapphire (SOS) and related technologies. Among the advantages are good isolation to prevent cross talk between circuit elements, simplified processing, reduced pinhole sensitivity, the possibility of utilizing the display in a back-lighted, transmissive mode of operation, and a greatly reduced sensitivity to ambient light.

In the preferred embodiment disclosed, an integrated storage capacitor is associated with each transistor in the array. One plate of this capacitor, as well as the transistor and a plurality of vertical drain buses for the carrying of video signals may all be formed in a single processing step. In another single processing step it is possible to form the second plates of the capacitors, the gate electrodes and a plurality of horizontal gate buses upon which control signals may be impressed for line at a time addressing.

Also in the preferred embodiment each bottom capacitor plate of a given vertical array is electrically shorted one to another thereby reducing the number of external ground connections required.

2 Claims, 7 Drawing Figures

METHOD OF MAKING INTEGRATED TRANSISTOR MATRIX FOR FLAT PANEL LIQUID CRYSTAL DISPLAY

This is a division of application Ser. No. 530,586, filed Dec. 9, 1974, now abandoned.

BACKGROUND OF THE INVENTION

1. Field of the Invention

This invention pertains generally to liquid crystal displays and in particular for integrated driver circuitry for use with flat panel matrix displays.

2. Description of the Prior Art

U.S. Pat. No. 3,824,003 in the name of N. J. Koda and L. T. Lipton entitled "Liquid Crystal Display Panel" and assigned to the same assignee as the present invention, relates to monolithic liquid crystal matrix display panels and discloses a circuit particularly adaptable for thin film transistor fabrication wherein a capacitor is effectively provided between the gate and drain of each control transistor. The teachings of that patent describe row at a time scanning of a matrix display and the use of the display at relatively fast (e.g. TV) frame rates. That patent also makes reference to a paper "Liquid Crystal Displays" by Bernard J. Letchner appearing in "Pertinent Concepts in Computergraphics," University of Illinois Press, 1969, wherein other addressing schemes including the one employed in the preferred embodiment described in detail hereinafter, are discussed.

Silicon on sapphire (SOS) and related technology are well known as evidenced for example by U.S. Pat. No. 3,393,008 in the name of H. M. Manasevit et al entitled "Epitaxial Deposition of Silicon on Alpha-Aluminum;" U.S. Pat. No. 3,392,056 in the name of N. J. Maskalick entitled "Method of Making Single Crystal Films and the Product Resulting Therefrom" and U.S. Pat. No. 3,424,955 in the name of H. Seiter et al entitled "Method for Epitaxial Precipitation of Semiconduction Material Upon a Spinel-Type Lattice Substrate." Mention might also be made of U.S. Pat. No. 3,484,662 in the name of P. J. Hagon entitled "Thin Film Transistor on an Insulating Substrate" which teaches the use of horizontal diffusion techniques underneath a mask in conjunction with monocrystalline silicon on a sapphire substrate and U.S. Pat. No. 3,783,052 in the name of J. A. Fisher, entitled "Process for Manufacturing Integrated Circuits on an Alumina Substrate" which teaches the formation of P regions by the upward migration of aluminum from the substrate to an N-type silicon layer provided on one surface thereof, as well as U.S. Pat. No. 3,740,280 in the name of R. S. Ronen entitled "Method of Making Semiconductor Device" which teaches the use of backlighting during the performance of an etching operation thereby taking advantage of the transparent optical properties of the substrate.

SUMMARY OF THE INVENTION

Briefly, the present invention lies in an improved integrated driving transistor array for use with liquid crystal flat panel matrix displays which results from the marrying of the circuitry of the prior art with silicon on sapphire and related technologies. In accordance with one preferred embodiment of the present invention a plurality of vertical arrays of field effect transistors, the transistors in each such vertical array being integral with a silicon drain bus connecting the drain regions thereof is formed on a sapphire or other appropriate substrate. It should be noted that cross talk between transistors as well as stray capacitance is greatly reduced as a result of the fact that the substrate is an insulator and that no direct electrical connection is made between the transistors in one such vertical array with the transistors in another such vertical array. Furthermore, within an array, the transistors are connected together by only a single bus line of monocrystalline silicon having a greatly reduced carrier lifetime.

Also in accordance with the preferred embodiment of the present invention it is possible to provide storage capacitors, one for each transistor in the array, without requiring additional processing steps inasmuch as the bottom plate of the capacitor may be formed in the same operation which forms the vertical array of silicon for the transistors and the drain buses. The insulator between the plates of the capacitor may be formed in the same operation which forms the gate oxide for the field effect transistors and the upper plate of the storage capacitors may be the individual electrodes of the flat panel display or may be a separate element electrically connected thereto.

BRIEF DESCRIPTION OF THE DRAWING

For a better understanding of the present invention, its construction and mode of operation, reference is made to the following description of a preferred embodiment and the appended drawings in which.

DESCRIPTION OF THE PREFERRED EMBODIMENT

Figure 1:
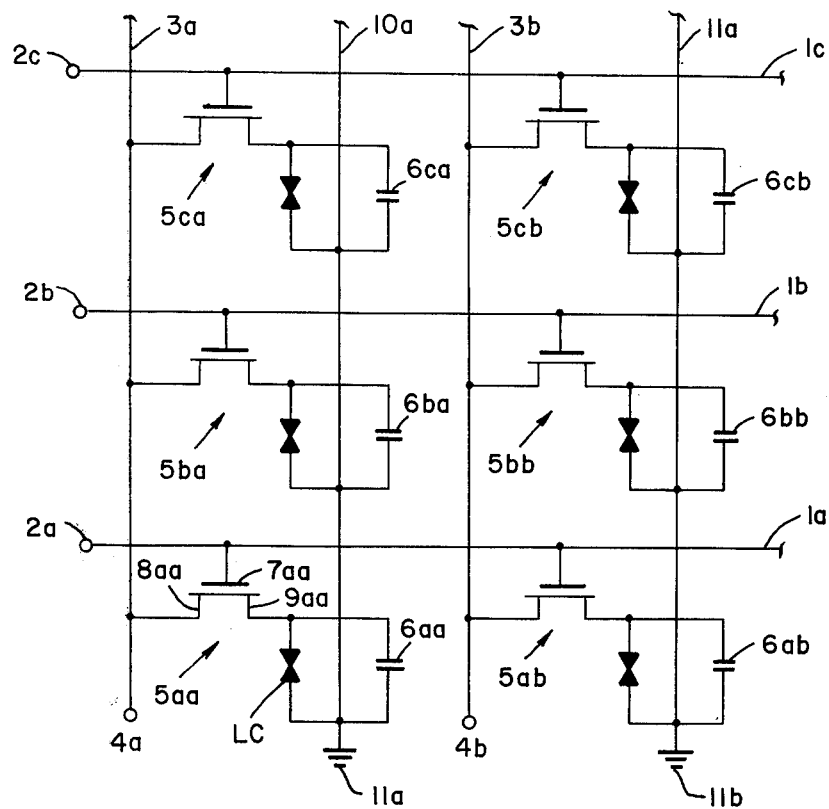
FIG. 1 shows an electrical schematic of a preferred embodiment of the present invention driving defined areas of a liquid crystal flat panel display.

Referring now to FIG. 1 wherein the circuit of the preferred embodiment is illustrated, it may be seen that there is provided a plurality of gate lines 1a, 1b, 1c, etc. provided with external terminations 2a, 2b and 2c, respectively. There is also provided a plurality of vertical drain buses 3a, 3b, etc., terminating respectively in drain bus terminators 4a, 4b. Associated with a particular pair of gate and drain buses (for instance 2a and 4a) is a control transistor 5aa and capacitor 6aa with the gate bus being connected to gate electrode 7aa and the drain bus being connected to the drain region 8aa of transistor 5aa. The purpose of capacitor 6aa is to store video or other signal information nearing the period when control transistor 5aa is in its non-conductive state so that a suitable voltage may continue to be applied across the proximate region of liquid crystal LC. One plate of capacitor 6aa is connected to the source region 9aa of transistor 5aa while the other plate is connected to a ground bus 10a which terminates in a ground connection 11a. Ground bus 10a is also connected to the corresponding plate of each of the other capacitors (6ba, 6ca, etc.) associated with the transistors connected to drain line 4a. There are also provided additional ground bus 10b etc., one for each drain bus. Using the circuit of FIG. 1 it is therefore possible to scan a line at a time liquid crystal contained in a flat panel display by providing appropriate timing signals sequentially to the various gate buses (2a, 2b, 2c, etc.) while a line of video or other signal information is being impressed on drain buses (4a, 4b, etc.), the information being passed by the appropriate control transistor and stored in the appropriate capacitor until that line is again scanned.

The liquid crystal flat panel display being used in the circuit of FIG. 1 may be any one of a number of types all well known in the prior art. Among such types might be mentioned a reflective mode dynamic scattering display wherein reflective elements are built into the display, each serving as one of the electrodes required to provide the current passing through a particular area of the liquid crystal. This current causes turbulence in the liquid crystal which forward scatters viewing light passing from the vicinity of the viewer through the liquid crystal. This scattered light is reflected in a direction away from the viewer (in the circuit carrying areas of the liquid crystal) by the reflectors.

Other possible modes of operation are dynamic scattering with a transmissive mode of operation wherein the light source is on one side of the flat panel and the viewer is on the opposite side. This mode of operation requires the panel to be constructed of transparent elements. Displays utilizing other liquid crystal electrical optical phenomena such as the twisted nematic field effect or the birefringent effect, both of which require the use of appropriate polarizers in order to make the signal information applied to the liquid crystal visible to a viewer, are also possible.

Yet another possible mode of operation of a flat panel display would utilize a storage effect such as is obtained with a cholesteric/nematic mixture. The use of such a mixture will permit a visible image to continue to be visible even after the electrode signal has been removed. In such a case the storage capacitors 6aa etc. are not required unless a fast scanning rate is envisioned.

Other possible departures from the circuit of FIG. 1 which may still lie within the spirit and purview of the present invention as defined by the appended claims, may be the placing of capacitors 6aa etc. in parallel across the gate electrode and source of the associated control transistor as was taught in the above-cited U.S. Pat. No. 3,824,003, thereby obviating the necessity for any additional ground buses. It would also be possible to integrate the matrix of FIG. 1 or other control transistor matrix with the required row and column drivers.

Figure 2:
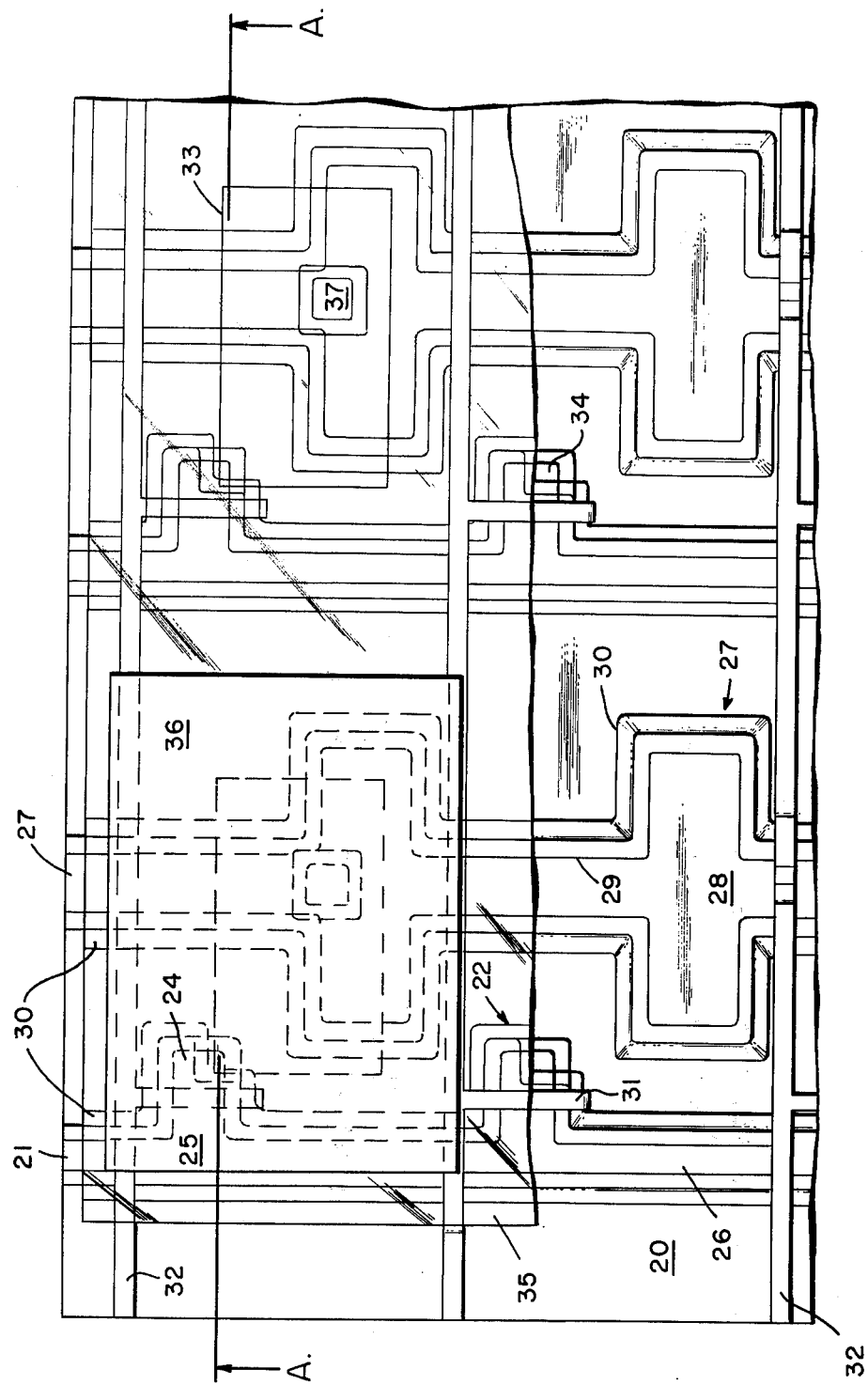
FIG. 2 is a bird's-eye plan view of a portion of a preferred embodiment of the integrated transistor matrix of the present invention in which selected portions have had the uppermost layers removed in the interest of clarity.
Figure 3:
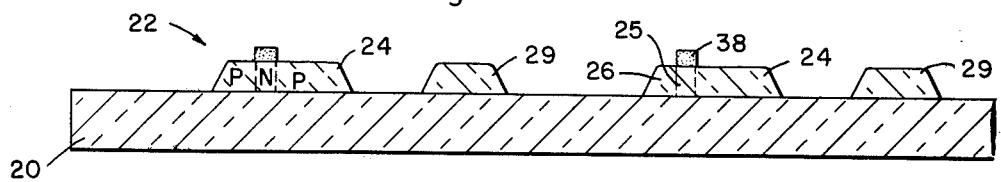
FIGS. 3, 4, 5 and 6 represent slices through the transistor matrix of FIG. 2 in the vicinity of the line A—A as the matrix is being fabricated.

Referring now to FIG. 2 wherein a preferred embodiment of a transistorized matrix is illustrated in plan view, it may be seen that an insulative substrate such as synthetic sapphire or other corundum or spinel-like material 20 has disposed on one surface thereof a plurality of vertical arrays 21 which are formed of monocrystalline silicon. Included in each such array is a plurality of transistor regions 22, each of such regions comprising a gate region 23, a source region 24 and a drain region 25. Connecting together the drain regions of a particular array is a drain bus 26 integral with the transistor regions of its array. Also provided on substrate 20 are a plurality of vertical capacitor bottom plate arrays 27 comprising bottom plate portions 28 and a means 29 for shorting together the various bottom plates, which means in the embodiment illustrated is also formed of monocrystalline silicon and is integral with the bottom plates. However, this connection to ground may also comprise a plurality of leads to an external control circuit or in the variation of FIG. 1 alluded to above and described in more detail in the aforementioned U.S. Pat. No. 3,824,003 may consist of a connection to the source or gate electrode of the associated control transistor, thereby obviating the necessity for a separate connection to ground.

At this point it might be wise to mention that FIG. 2 is not drawn to scale but the size of certain circuit elements has been greatly exaggerated in the interest of clarity. In particular it might be noted that in order to maximize the capacitance of capacitor 6 (FIG. 1), it might well be advisable to make bottom plates 28 much larger an area than is shown while control transistor 22 need not be nearly as large in comparison. In that case and assuming that a transparent mode of operation is desirable, bottom electrode 28 should be made of a transparent material so that the transparent properties of substrates 20 may be used to advantage. One possible transparent conductive material for forming plates 28 and buses 29 would be tin oxide.

Overlying the monocrystalline silicon of arrays 21 and 27 is a layer of a suitable insulator such as silicon dioxide 30. This insulating layer serves in the case of transistor regions 22 to isolate the gate electrode 31 from the gate 23 and the gate bus 32 from ground bus 29 thereby permitting a field effect transistor array to be implemented. It also serves to insulate bottom plate 28 from top plate 33 (only two are shown in the figure in the interest of clarity) thereby creating capacitance between said top and bottom plates. Although the insulator layer 30 is shown only over the monocrystalline arrays 21 and 27, it would obviously be possible to continue this layer over the whole surface of the array including the exposed portions of insulating substrate 20. Provided within the insulative layer 30 over source region 24 is a hole 34 through which the conductive metal or other material of top plate 33 may make ohmic contact with the associated source region. The whole of the matrix may then be covered with an overglassing layer 35 of, for example, silicon dioxide, which serves to protect the semiconductors, capacitors and associated electrodes. Deposited over this overglassing layer are suitable reflective (e.g., chrome) or transparent (e.g., tin oxide) electrodes 36 which actually drive the liquid crystal material in, for example, the dynamic scattering mode. Only one such electrode is shown in the figure, but in an actual device, one is provided for each capacitor 6 (FIG. 1). Electrodes 36 are connected to top plates 33 by means of an opening 37 in the overglassing layer.

The construction of such a matrix will now be discussed making particular reference to FIGS. 3, 4, 5, 6 and 7.

It is possible to obtain commercially sapphire substrates in wafer form on which a thin layer of monocrystalline silicon has been deposited. Alternatively, such substrate/silicon wafers may be constructed in accordance with the teachings of the various aforecited SOS patents. Using conventional etching techniques, the pattern of vertical arrays comprising drain buses and control transistor regions as well as vertical arrays comprising bottom capacitor plates and ground buses may be formed resulting in the structure shown in cross-section in FIG. 3. Gate region 23 is obtained by means of a mask 38 and suitable doping techniques. By way of example it is possible to start with n-type silicon and by means of boron deposition to make all of the silicon with the exception of the aforesaid gate regions p-type, thereby resulting in a p-n-p field effect transistor as well as conductive drain buses, bottom electrode plates and ground buses. We have found that a sheet resistance of less than 50 ohms per square is readily achievable by means of such a process and produces a useful device.

Figure 4:
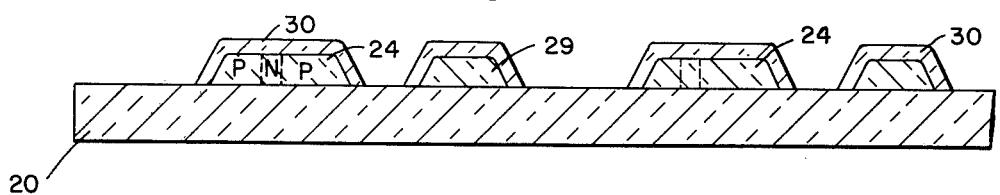

Referring now to FIG. 4, it may be seen that, after the gate mask has been removed, insulating layer 30 may now be grown all over the monocrystalline silicon, thereby forming the gate insulation of the field effect transistor 5 as well as the insulation between the plates of capacitor 6 (FIG. 1).

Figure 5:
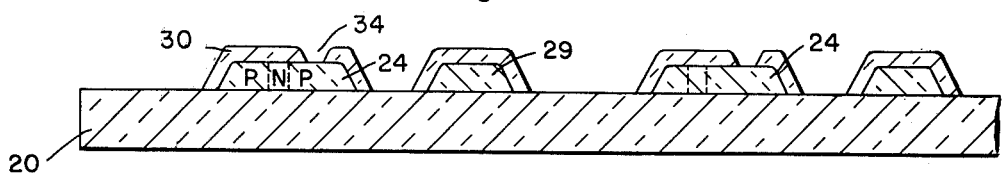

As shown in FIG. 5 the next step is to etch the hole 34 in the gate oxide over the source region 24 of transistor region 22 in order to allow electric contact to be made to the source of the transistor.

Figure 6:
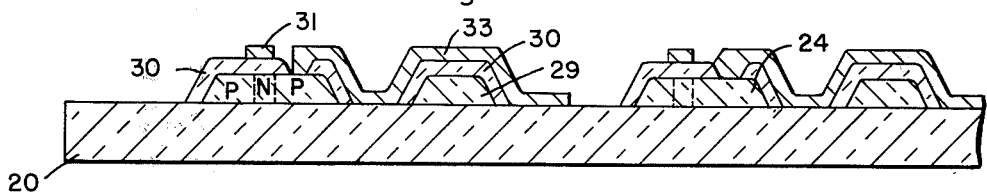

Referring now to FIG. 6 it may be seen that the next step is in the formation of suitable conductor patterns to form gate electrode 31, gate bus 32, as well as top capacitor plate 33. Assuming that a reflective mode display is intended, these conductors may be made for example of aluminum deposited over the whole of the wafer and then suitably etched to form the required patterns. It should be noted that top capacitor plate 33 extends over the vicinity of hole 34 thereby making ohmic contact to source region 24. Obviously it would also be possible to form these conductors of a transparent material such as tin oxide.

At this point all the required components of FIG. 1 have been constructed with the exception of the liquid crystal material itself and the electrodes making contact thereto. One possibility for utilization of the matrix thus formed would be in a field effect mode of operation or an ac mode of operation wherein no direct electric contact is required between top plate 33 and the liquid crystal material. In that case it would be possible to overglass the entire array of FIG. 6. However, a reflective dynamic scattering mode of operation is envisioned in the figures by way of example.

Figure 7:
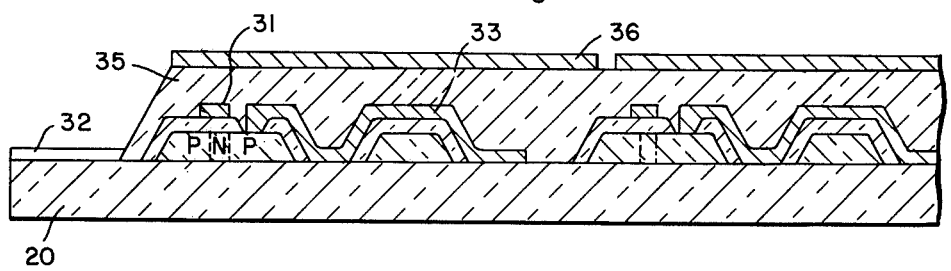
FIG. 7 shows in cross-section the completed matrix of FIG. 2 along the line A—A.

Referring now to FIG. 7, it may be seen that the overglassing area 35 covers the hole of transistor region 22 and the other active circuit elements, thereby protecting them. But an opening 37 is provided in this overglassing layer in order that the electrode 36 may be formed which may be placed in direct contact with the liquid crystal material and also make contact with the top plate 33. Even if a dynamic scattering mode of operation is not contemplated, this mode of construction might well be preferable inasmuch as it permits the electrodes 36 to be large in area, thereby overlapping not only essentially all of capacitor 6 (formed of bottom plate 28, insulative layer 30, and top plate 33) but also much of the remaining area on the wafer including that portion over transistor region 22.

It will thus be seen that a drive matrix for use with flat panel liquid crystal displays may be readily constructed using silicon on sapphire or other related technologies. Paramount among the advantages of the present invention is the almost complete absence of cross talk between the various elements of the matrix. This not inconsiderable benefit is the result not only of the fact that insulating substrate 20 insulates the silicon associated with one vertical array with the silicon associated with another vertical array, thereby allowing complete electrical isolation between columns, but also of the fact that the semiconductor areas of the device thus formed have an exceedingly short carrier lifetime (on the order of 1 nanosecond) and are therefore relatively insensitive to the presence of ambient light. In the case of any liquid crystal display light is required in order to see the optical image carried in the liquid crystal medium. Accordingly, very high intensity projection light or other bright ambient lighting may be used. It is even possible to employ the present invention in the construction of a display using a transmissive mode of operation which of course requires that no light shielding layers be present within the device.

Yet another advantage of constructing the transistor matrix of a flat panel liquid crystal display in accordance with the present invention is that the use of silicon on sapphire or other related technology results in a very flat display with little or no warpage being produced in the processing steps; furthermore, relatively thin layers are utilized. This flatness and thinness results in less unwanted diffusion of the ambient light should a reflective mode of display be envisioned. It also permits the use of thinner layers of liquid crystal material (and therefore lower voltages).

It might also be noted that in the case of a transmissive mode display, it is a very simple matter to adapt the present invention for three color operation. This would require only the placing of a suitable arrangement of colored spots or strips in register with the various elements of the transistor array in order that the transmitted light is suitably filtered, each such element having associated therewith a particular color.

The transistor array of the present invention may also find application in electro-optical displays not utilizing liquid crystals.

What is claimed is:

1. A method for constructing a transistor/capacitor array for driving a liquid crystal material, said method comprising the steps of:
    a. providing an insulating substrate having a thin layer of monocrystalline silicon formed on one surface thereof;
    b. etching said silicon layer into a pattern forming a plurality of isolated vertical arrays, each vertical array including a pair of elongated members, each having a plurality of lateral extensions;
    c. masking an intermediate portion of each extension on one elongated member of each array and doping the unmasked portions of said arrays, thereby forming:
        1. spaced-apart source and drain regions in the lateral extensions on said one elongated member of each array; and
        2. conductive bottom capacitor plates of the lateral extensions on the other elongated member of each array;
    d. growing an insulating layer over essentially all of the monocrystalline silicon;
    e. exposing each said source region through an individual opening formed above it in said insulating layer;
    f. forming a conductive layer over said insulating layer; and
    g. etching said conductive layer into a pattern forming:
        1. a plurality of horizontal gate buses and gate electrodes integral therewith, each of said gate electrodes extending over a respective one of said gate regions; and 2. a plurality of discrete top capacitor plates, respective ones of said top capacitor plates overlying a corresponding one of said bottom capacitor plates and extending through one of said openings to make contact with a corresponding one of said exposed source regions.

2. The method of claim 1 further comprising the steps of:
forming an encapsulation layer over essentially all of said array with the exception of an area of each of said top capacitor plates; and
forming a plurality of reflective metal pads, each making ohmic contact to a respective one of said top capacitor plate areas.

* * * * *